(12) United States Patent
Yokoyama et al.

(10) Patent No.: US 10,141,211 B2
(45) Date of Patent: Nov. 27, 2018

(54) SUBSTRATE PROCESSING APPARATUS AND SUBSTRATE TRANSFER METHOD

(71) Applicant: EBARA CORPORATION, Tokyo (JP)

(72) Inventors: Toshio Yokoyama, Tokyo (JP); Masahiko Sekimoto, Tokyo (JP); Kenichi Kobayashi, Tokyo (JP); Kenichi Akazawa, Tokyo (JP); Takashi Mitsuya, Tokyo (JP); Keiichi Kurashina, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/690,025

(22) Filed: Aug. 29, 2017

(65) Prior Publication Data

US 2017/0358472 A1    Dec. 14, 2017

Related U.S. Application Data

(62) Division of application No. 14/666,196, filed on Mar. 23, 2015, now Pat. No. 9,786,532.

(30) Foreign Application Priority Data

Mar. 24, 2014   (JP) ................. 2014-059565

(51) Int. Cl.
  *H01L 21/677*   (2006.01)
  *H01L 21/67*    (2006.01)
  *H01L 21/687*   (2006.01)

(52) U.S. Cl.
  CPC .. *H01L 21/67718* (2013.01); *H01L 21/67086* (2013.01); *H01L 21/67751* (2013.01); *H01L 21/68707* (2013.01)

(58) Field of Classification Search
  CPC ................................ H01L 21/67718
  See application file for complete search history.

(56) References Cited

U.S. PATENT DOCUMENTS

| 6,294,059 | B1 | 9/2001 | Hongo et al. |
| 9,257,317 | B2 | 2/2016 | Lee et al. |
| 2002/0027080 | A1 | 3/2002 | Yoshioka et al. |
| 2005/0082163 | A1* | 4/2005 | Yoshioka ............... C25D 17/02 204/198 |
| 2008/0245669 | A1 | 10/2008 | Yoshioka et al. |

(Continued)

FOREIGN PATENT DOCUMENTS

| EP | 0301710 A1 | 2/1989 |
| JP | S64-037016 A | 2/1989 |

(Continued)

*Primary Examiner* — Gerald McClain
(74) *Attorney, Agent, or Firm* — Baker & Hostetler LLP

(57) ABSTRACT

A substrate processing apparatus comprises a transferring device including a grasping section configured to grasp a substrate holder, and a transferring section configured to transfer the substrate holder grasped by the grasping section, and a processing bath for storing a substrate held by the substrate holder so that a surface of the substrate is vertically oriented, and processing the substrate. The grasping section is configured to grasp the substrate holder with a surface of the substrate oriented horizontally. The transferring section is configured to transfer the substrate holder above the processing bath, with the surface of the substrate oriented horizontally.

11 Claims, 14 Drawing Sheets

(56) References Cited

U.S. PATENT DOCUMENTS

| | | | |
|---|---|---|---|
| 2009/0067959 | A1 | 3/2009 | Takahashi et al. |
| 2009/0090631 | A1 | 4/2009 | Dubin et al. |
| 2010/0006444 | A1 | 1/2010 | Endo et al. |
| 2012/0100709 | A1 | 4/2012 | Minami |
| 2012/0152749 | A1 | 6/2012 | Yasuda et al. |
| 2012/0308346 | A1 | 12/2012 | Keilger et al. |
| 2014/0245954 | A1 | 9/2014 | Minami et al. |
| 2014/0302676 | A1 | 10/2014 | Miyazaki et al. |
| 2015/0270147 | A1 | 9/2015 | Kobayashi et al. |
| 2015/0357213 | A1 | 12/2015 | Yokoyama et al. |

FOREIGN PATENT DOCUMENTS

| | | | |
|---|---|---|---|
| JP | H06-151677 A | | 5/1994 |
| JP | H11-154653 A | | 6/1999 |
| JP | 2001097552 A | * | 4/2001 |
| JP | 2005-139513 A | | 6/2005 |
| JP | 2009-295849 A | | 12/2009 |
| JP | 2010-018841 A | | 1/2010 |
| WO | WO 2001/68952 A1 | | 9/2001 |

\* cited by examiner

SUBSTRATE PROCESSING APPARATUS AND SUBSTRATE TRANSFER METHOD

This application is a divisional of U.S. application Ser. No. 14/666,196 filed on Mar. 23, 2015, which claims the priority and the benefit of Japanese Patent Application No. 2014-059565 filed in Japan on Mar. 24, 2014, the entire contents of which are incorporated herein by this reference.

The present invention relates to a substrate processing apparatus that processes substrates such as semiconductor wafers and a substrate transfer method.

BACKGROUND ART

It is conventional practice to form a wiring line in a fine wiring groove, a hole, or a resist opening provided in the surface of a semiconductor wafer etc., or to form a bump (protruding electrode), which is electrically connected with an electrode on a packaging substrate etc., on the surface of a semiconductor wafer etc. Known methods for forming such wiring lines and bumps include, for example, an electroplating method, a vapor deposition method, a printing method, and a ball bump method, etc. Due to increase in the number of I/Os and the reduction in pitch of semiconductor chips in the recent years, the electroplating method which allows for miniaturization and relatively stable performance has been widely used.

In the process of forming a wiring line in a resist opening by an electroplating method, the wiring line is formed in the resist opening, and thereafter, resist formed on the substrate is removed and a seed layer (or a barrier metal) is etched. The process of forming the wiring line, the process of removing the resist, the etching process of the seed layer and the like are performed by dipping the substrate into a processing bath accommodating a predetermined processing solution. As the processing bath, a processing bath which is capable of accommodating a substrate upright (vertically) is known (Re-publication of PCT International Publication No. WO 01/68952, for example).

In the case where processing is performed with a substrate vertically accommodated, when a substrate holder holding the substrate is transferred, the substrate holder is transferred above the processing bath with the substrate holder being also oriented in the upright (vertical) direction. If another substrate holder is put in and taken out from the processing bath when the substrate holder is transferred with the substrate holder being oriented in the upright direction like this, the other substrate holder becomes an obstacle of transfer of the substrate holder. Therefore, while another substrate holder is put in and taken out from the processing bath, transfer of the substrate holder needs to be awaited, and there arises the problem of reduction in the throughput of the entire substrate processing apparatus.

SUMMARY

The present invention is made in the light of the above described problem, and an object of the present invention is to eleiminate a waiting time at a time of transfer of a substrate holder, and improve throughput of substrate processing.

According to one aspect of the present invention, a substrate processing apparatus is provided. The substrate processing apparatus comprises a transferring device including a grasping section configured to grasp a substrate holder, and a transferring section configured to transfer the substrate holder grasped by the grasping section, and a processing bath for storing the substrate holder holding a substrate with a surface of the substrate being vertically oriented, and processing the substrate, wherein the grasping section is configured to grasp the substrate holder with a surface of the substrate being horizontally oriented, and the transferring section is configured to transfer the substrate holder above the processing bath with the surface of the substrate being horizontally oriented.

According to one aspect of the present invention, a substrate transfer method is provided. The substrate transfer method comprises transferring a substrate holder holding a substrate above a processing bath with a surface of the substrate being horizontally oriented, turning the substrate holder so that the surface of the substrate is vertically oriented, and storing the substrate holder into the processing bath with the surface of the substrate being vertically oriented.

According to the present invention, a waiting time at the time of transfer of the substrate holder is eliminated, and the throughput of substrate processing can be improved.

DESCRIPTION OF EMBODIMENTS

Figure 1:
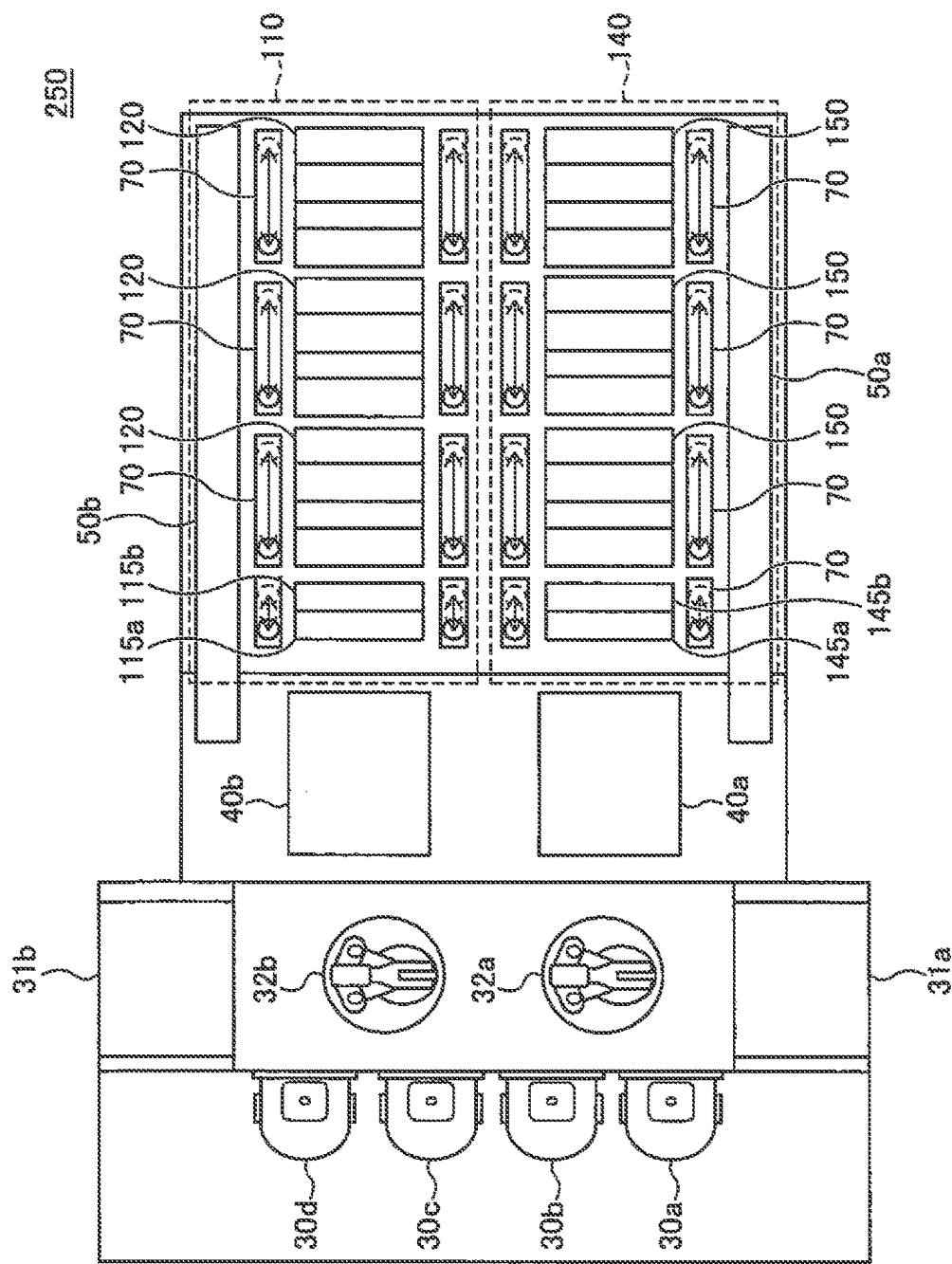
FIG. 1 is a schematic plan view of a substrate processing apparatus according to one embodiment.

According to a first aspect of a present embodiment, a substrate processing apparatus is provided. The substrate processing apparatus comprises a transferring device including a grasping section configured to grasp a substrate holder, and a transferring section configured to transfer the substrate holder grasped by the grasping section, and a processing bath for storing the substrate holder holding a substrate with a surface thereof oriented vertically, and processing the substrate, wherein the grasping section is configured to grasp the substrate holder with surface of the substrate oriented horizontally, and the transferring section is configured to transfer the substrate holder above the processing bath with the surface of the substrate oriented horizontally.

According to a second aspect of the present embodiment, in the substrate processing apparatus of the first aspect, the substrate processing apparatus comprises a lifter configured to support the substrate holder, and store the substrate holder into the processing bath or take out the substrate holder from the processing bath.

According to a third aspect of the present embodiment, in the substrate processing apparatus of the second aspect, the transferring device comprises a drive mechanism configured to turn the grasping section grasping the substrate holder so that the surface of the substrate is vertically oriented, and the lifter is configured to receive the substrate holder which is grasped with the surface of the substrate oriented vertically, from the transferring device.

According to a fourth aspect of the present embodiment, in the substrate processing apparatus of the first aspect, the substrate processing apparatus comprises a blowing mechanism configured to blow gas, wherein the grasping section is configured to grasp the substrate holder with the surface of the substrate oriented horizontally and a processed surface of the substrate facing upward, and the blowing mechanism is configured to blow gas toward the processed surface of the substrate grasped by the grasping section.

According to a fifth aspect of the present embodiment, in the substrate processing apparatus of the first aspect, the grasping section comprises a pressing member configured to press the substrate to the substrate holder.

According to a sixth aspect of the present embodiment, a substrate processing apparatus is provided. The substrate processing apparatus comprises a transferring device including a grasping section configured to grasp a substrate holder, and a transferring section configured to transfer the substrate holder grasped by the grasping section, a processing bath for storing the substrate holder holding a substrate with a surface of the substrate oriented vertically, and processing the substrate, a lifter configured to support the substrate holder, and store the substrate holder into the processing bath or take out the substrate holder from the processing bath, and a blowing mechanism configured to blow gas, wherein the grasping section is configured to grasp the substrate holder with the surface of the substrate oriented horizontally and a processed surface of the substrate facing upward, the transferring section is configured to transfer the substrate holder above the processing bath with the surface of the substrate oriented horizontally, and the blowing mechanism is configured to blow gas toward the processed surface of the substrate grasped by the grasping section.

According to a seventh aspect of the present embodiment, in the substrate processing apparatus of the sixth aspect, the transferring device comprises a drive mechanism configured to turn the grasping section grasping the substrate holder so that the surface of the substrate is vertically oriented, and the lifter is configured to receive the substrate holder which is grasped with the surface of the substrate oriented vertically, from the transferring device.

According to an eighth aspect of the present embodiment, a substrate processing apparatus is provided. The substrate processing apparatus comprises a transferring device including a grasping section configured to grasp a substrate holder, and a transferring section configured to transfer the substrate holder grasped by the grasping section, a processing bath for storing the substrate holder holding a substrate with a surface of the substrate oriented vertically, and processing the substrate, and a lifter configured to support the substrate holder, and store the substrate holder into the processing bath or take out the substrate holder from the processing bath, wherein the grasping section is configured to grasp the substrate holder with a surface of the substrate oriented horizontally, the transferring section is configured transfer the substrate holder above the processing bath with the in-plane direction of the substrate being horizontally oriented, and the grasping section comprises a pressing member configured to press the substrate to the substrate holder.

According to a ninth aspect of the present embodiment, in the substrate processing apparatus of the eighth aspect, the transferring device comprises a drive mechanism configured to turn the grasping section grasping the substrate holder so that the surface of the substrate is vertically oriented, and the lifter is configured to receive the substrate holder which is grasped with the surface of the substrate being oriented vertically, from the transferring device.

According to a tenth aspect of the present embodiment, in the substrate processing apparatus of the eighth embodiment, the substrate processing apparatus comprises a blowing mechanism configured to blow gas, wherein the grasping section is configured to grasp the substrate holder with the surface of the substrate oriented horizontally and a processed surface of the substrate facing upward, and the blowing mechanism is configured to blow gas toward the processed surface of the substrate grasped by the grasping section.

According to an eleventh aspect of the present embodiment, in the substrate processing apparatus of the ninth aspect, the substrate processing apparatus comprises a blowing mechanism configured to blow gas, wherein the grasping section is configured to grasp the substrate holder with the surface of the substrate oriented horizontally and a processed surface of the substrate facing upward, and the blowing mechanism is configured to blow gas toward the processed surface of the substrate grasped by the grasping section.

According to a twelfth aspect of the present embodiment, a substrate transfer method is provided. The substrate transfer method comprises transferring a substrate holder holding a substrate above a processing bath with a surface of the substrate oriented horizontally, turning the substrate holder so that the surface of the substrate is vertically oriented, and storing the substrate holder into the processing bath with the surface of the substrate oriented vertically.

According to a thirteenth aspect of the present embodiment, in the substrate transfer method of the twelfth aspect, the substrate transfer method comprises taking out the substrate holder stored in the processing bath with the surface of the substrate oriented vertically, and turning the substrate holder which is taken out so that the surface of the substrate is horizontally oriented.

Hereinafter, a more detailed embodiment will be described with reference to the drawings. In the drawings which will be described hereinafter, the same or corresponding components will be assigned with the same reference signs, and redundant explanation will be omitted.

FIG. 1 is a schematic plan view of the substrate processing apparatus according to the present embodiment.

As shown in FIG. 1, in a substrate processing apparatus 250, four cassettes 30a, 30b, 30c and 30d that store substrates such as semiconductor wafers, two substrate dryers 31a and 31b that dry the substrates after processing the substrates, fixing units 40a and 40b that mount and remove substrates on and from substrate holders, and two robot hands 32a and 32b that transfer substrates to and from these units are disposed. Note that in positions where the substrate dryers 31a and 31b are disposed, two substrate driers are respectively disposed in a vertical direction, so that four substrate driers may be disposed in the substrate processing apparatus 250.

A substrate to be processed in a resist removing unit 140 which will be described later is taken out by the robot hand 32a from the cassette 30a or the cassette 30b, and is transferred to the fixing unit 40a. A resist on a surface of the substrate which is mounted on a substrate holder in the fixing unit 40a is thereafter removed in the resist removing unit 140. The substrate from which the resist is removed in the resist removing unit 140 is taken out from the substrate holder in the fixing unit 40a. The substrate taken out from the substrate holder is transferred from the fixing unit 40a to the substrate dryer 31a by the robot hand 32a. The substrate is cleaned and dried with use of IPA and DIW (De-Ionized Water) by the substrate dryer 31a. The dried substrate is returned to the cassette 30a or the cassette 30b by the robot hand 32a.

Likewise, a substrate to be subjected to etching processing in an etching unit 110 that will be described later is taken out from the cassette 30c or the cassette 30d by the robot hand 32b, and is transferred to the fixing unit 40b. The substrate mounted on the substrate holder in the fixing unit 40b is subjected to etching processing in the etching unit 110 thereafter. The substrate to which etching processing is applied in the etching unit 110 is taken out from the substrate holder in the fixing unit 40b. The substrate taken out from the substrate holder is transferred from the fixing unit 40b to the substrate dryer 31b by the robot hand 32b. The substrate is cleaned and dried with use of IPA and DIW by the substrate dryer 31b. The dried substrate is returned to the cassette 30c or the cassette 30d by the robot hand 32b.

Further, in the substrate processing apparatus 250, the resist removing unit 140 which removes the resist formed on a substrate is provided. The resist removing unit 140 includes two pre-wet baths 145a and 145b for enhancing hydrophilicity of a substrate surface, and three resist removing modules 150 for removing the resist formed on a substrate. The resist removing modules 150 are each constructed of a plurality of baths. The pre-wet baths 145a and 145b include lifters 70 disposed along both sides of the baths, which store or take out the substrate holders into or from the pre-wet baths 145a and 145b and are horizontally movable. Likewise, the resist removing module 150 includes the lifters 70 disposed along both sides of the baths, which store or take out the substrate holders into or from the plurality of baths constructing the resist removing module 150. Further, the resist removing unit 140 includes a substrate transfer device 50a (corresponding to one example of a transferring device) that transfers substrates between the fixing unit 40a, the lifters 70 included by the pre-wet baths 145a and 145b, and the lifters 70 included by the resist removing modules 150.

When the resist on a substrate is removed, the substrate holder holding the substrate is transferred to the substrate transfer device 50a from the fixing unit 40a, and is transferred to the lifters 70 included by the pre-wet baths 145a or 145b by the substrate transfer device 50a. The lifters 70 store the transferred substrate holder into a vacant bath out of the pre-wet bath 145a and the pre-wet bath 145b. DIW and IPA are sprayed to the substrate in the pre-wet bath 145a or the pre-wet bath 145b. After the substrate is processed in the pre-wet bath 145a or the pre-wet bath 145b, the substrate holder is taken out from the pre-wet bath 145a or the pre-wet bath 145b by the lifters 70, and is transferred to the substrate transfer device 50a. The substrate holder is transferred to the lifters 70 of any one of the resist removing modules 150 by the substrate transfer device 50a, and is stored into the processing bath of the resist removing module 150 by the lifters 70. After the substrate is processed in the resist removing module 150, the substrate holder is taken out from the processing bath by the lifters 70 of the resist removing module 150, and is transferred to the substrate transfer device 50a. The substrate holder is returned to the fixing unit 40a by the substrate transfer device 50a.

Further, in the substrate processing apparatus 250, an etching unit 110 that performs etching of a seed layer formed on a substrate is provided. The etching unit 110 includes two pre-wet baths 115a and 115b for enhancing hydrophilicity of a substrate surface, and three etching modules 120 for etching the seed layer formed on the substrate. The etching modules 120 are each constructed of a plurality of baths. The pre-wet baths 115a and 115b include the lifters 70 which store or take out a substrate holder into or from the pre-wet baths 115a and 115b, along both sides of the baths. Likewise, the etching module 120 includes the lifters 70 that store or take out a substrate holder into or from the plurality of baths constructing the etching module 120, along both sides of the baths. Further, the etching unit 110 includes a substrate transfer device 50b (corresponding to one example of the transferring machine) that transfers a substrate to and from the fixing unit 40b, the lifters 70 included by the pre-wet baths 115a and 115b, and the lifters 70 included by the etching modules 120.

When the seed layer of a substrate is etched, the substrate holder holding a substrate is transferred from the fixing unit 40b to the substrate transfer device 50b, and is transferred to the lifters 70 included by the pre-wet baths 115a and 115b by the substrate transfer device 50b. The lifter 70 stores the transferred substrate holder into a vacant bath out of the pre-wet bath 115a and the pre-wet bath 115b. In the pre-wet bath 115a or the pre-wet bath 115b, DIW or IPA is sprayed to the substrate. After the substrate is processed in the pre-wet bath 115a or the pre-wet bath 115b, the substrate holder is taken out from the pre-wet bath 115a or the pre-wet bath 115b by the lifters 70, and is transferred to the substrate transfer device 50b. The substrate holder is transferred to the lifters 70 of any one of the etching modules 120 by the substrate transfer device 50b, and is stored into the processing bath of the etching module 120 by the lifters 70. After the substrate is processed in the etching module 120, the substrate holder is taken out from the processing bath by the lifters 70 of the etching module 120, and is transferred to the substrate transfer device 50b. The substrate holder is returned to the fixing unit 40b by the substrate transfer device 50b.

As illustrated, in the substrate processing apparatus 250, the cassettes 30c and 30d, the substrate dryer 31b, the robot hand 32b, the fixing unit 40b and the etching unit 110 are configured to be in a substantially symmetrical positional relation with respect to the cassettes 30a and 30d, the substrate dryer 31a, the robot hand 32a, the fixing unit 40a and the resist removing unit 140.

Figure 2:
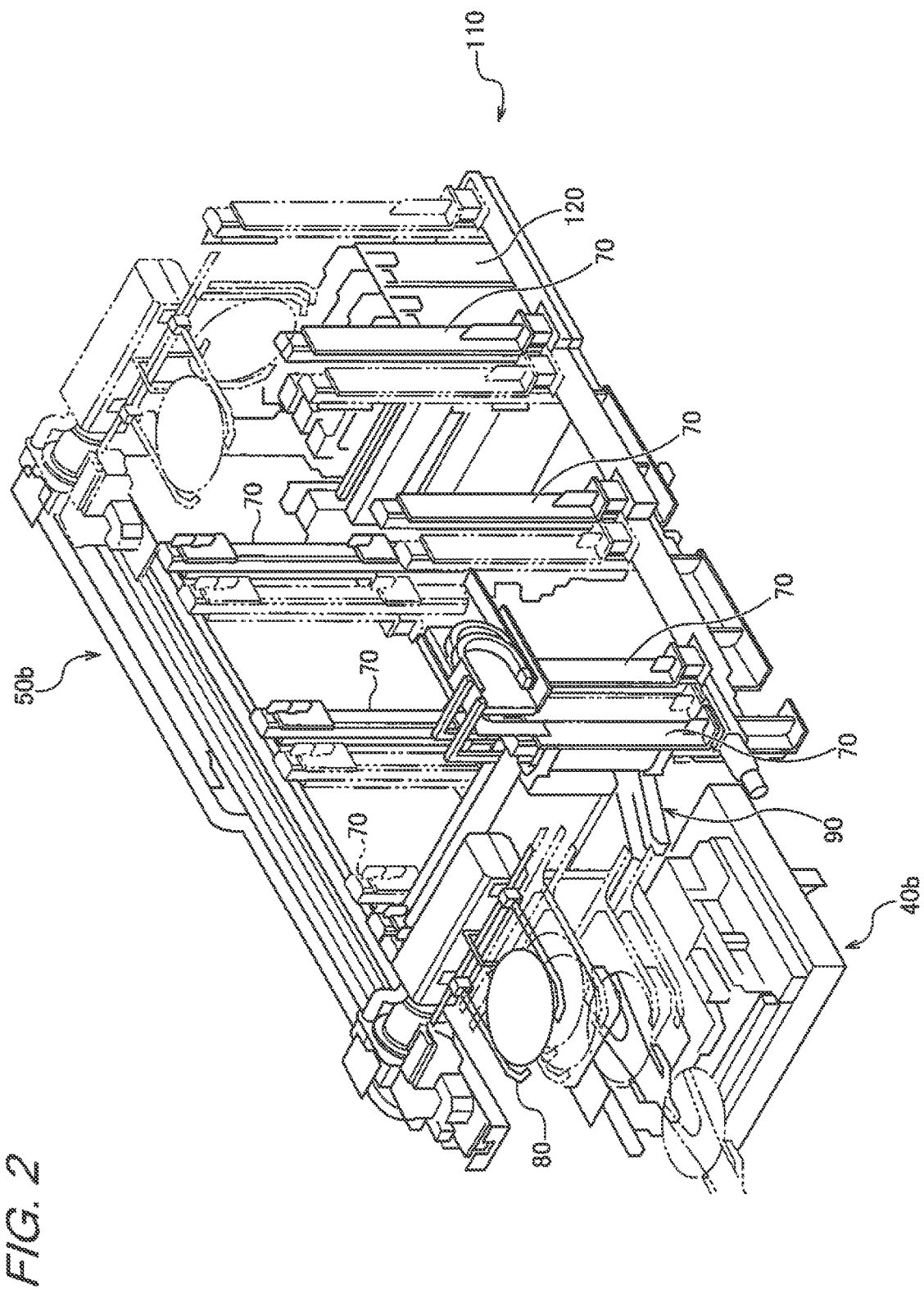
FIG. 2 is a schematic perspective view showing a fixing unit and an etching unit.

Next, a positional relation of the fixing unit 40b and the etching unit 110 shown in FIG. 1 will be described. FIG. 2 is a schematic perspective view showing the fixing unit 40b and the etching unit 110 shown in FIG. 1. Note that in FIG. 2, illustration of the pre-wet baths 115a and 115b and the two etching modules 120 is omitted for convenience.

As illustrated, the fixing unit 40b and the etching unit 110 are disposed to be aligned in a straight line. The pre-wet baths 115a and 115b (not illustrated) and the three etching modules 120 (only one of them is illustrated) respectively include the lifters 70 disposed along an aligned direction, at lateral sides of the baths. Each of the lifters 70 is configured to be movable in the horizontal direction, from one end to the other end of each of the processing baths. That is to say, the respective lifters 70 can move to positions of the lifters 70 shown by broken lines in the drawing.

The substrate transfer device 50b transfers a substrate holder 80 so that the substrate holder 80 passes above the fixing unit 40b and the etching unit 110. Each of the lifters 70 includes a cover 90 configured to cover a periphery of the substrate holder 80 which is supported by the lifters 70. Note that in the lifters 70 of the etching module 120 in the drawing, the covers 90 are not illustrated.

The fixing unit 40a and the resist removing unit 140 shown in FIG. 1 also have a positional relation similar to the fixing unit 40b and the etching unit 110 shown in FIG. 2, except that the position of the substrate transfer device 50a differs. Accordingly, explanation of the positional relation of the fixing unit 40a and the resist removing unit 140 will be omitted.

Next, details of the substrate holder 80, the fixing unit 40b, the substrate transfer device 50b and the lifter 70 shown in FIG. 2 will be described in sequence.

<Substrate Holder>

Figure 3:
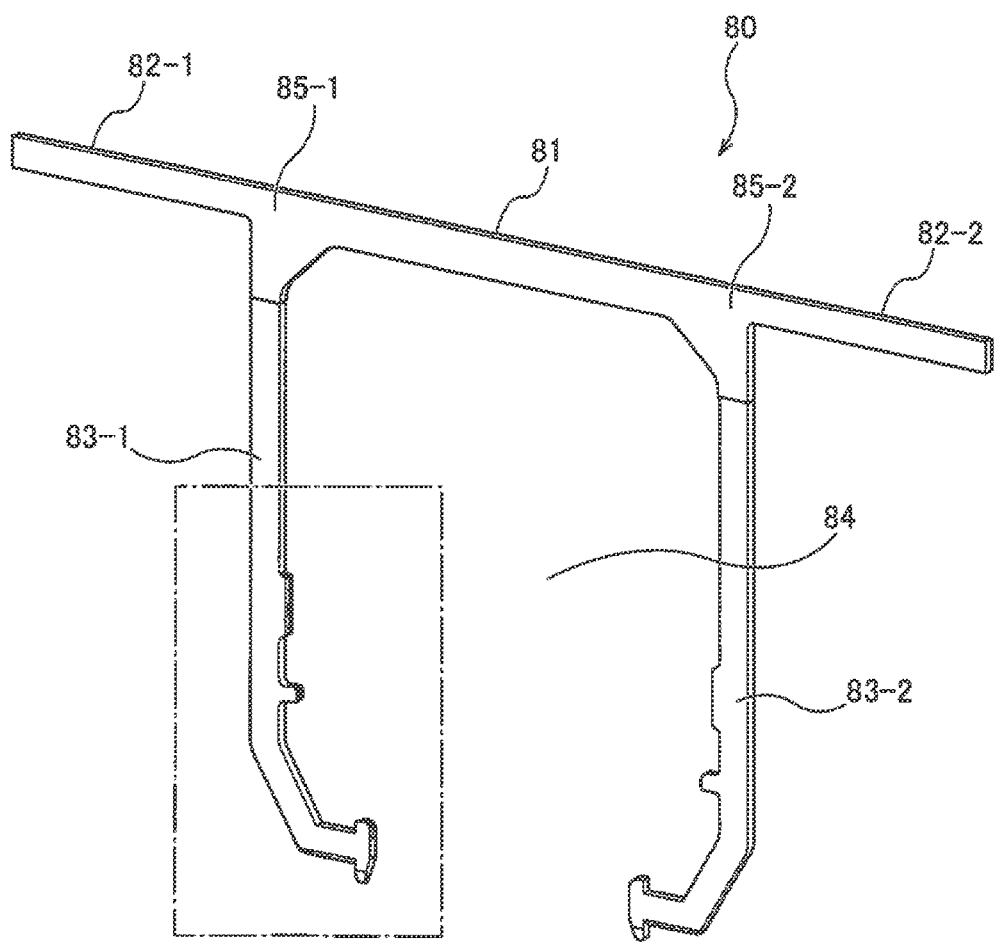
FIG. 3 is a perspective view of a substrate holder.

FIG. 3 is a perspective view of the substrate holder 80. As illustrated, the substrate holder 80 has a base portion 81 that is a board-shaped member formed to be elongated, two arm portions 82-1 and 82-2 that are board-shaped members formed by extending from both ends of the base portion 81, and two holder portions 83-1 and 83-2 for holding a substrate. Spots where the base portion 81, the arm portions 82-1 and 82-2 and the holder portions 83-1 and 83-2 intersect one another are grasped portions 85-1 and 85-2 of the substrate holder 80, and the grasped portions 85-1 and 85-2 are grasped by the substrate transfer device 50. The arm portions 82-1 and 82-2 are board-shaped members which extend from both the ends of the base portion 81. The arm portions 82-1 and 82-2 are portions that are suspended on side walls of a processing bath when the substrate holder 80 is dipped into the processing bath as will be described later, and are portions that are supported by the lifters 70. The holder portions 83-1 and 83-2 are board-shaped members in substantially L-shapes that are formed in substantially perpendicular directions to a longitudinal direction of the base portion 81, from both the ends of the base portion 81. The substrate holder 80 can accommodate and hold a substrate such as a semiconductor wafer in a space 84 between the holder portion 83-1 and the holder portion 83-2.

Figure 4:
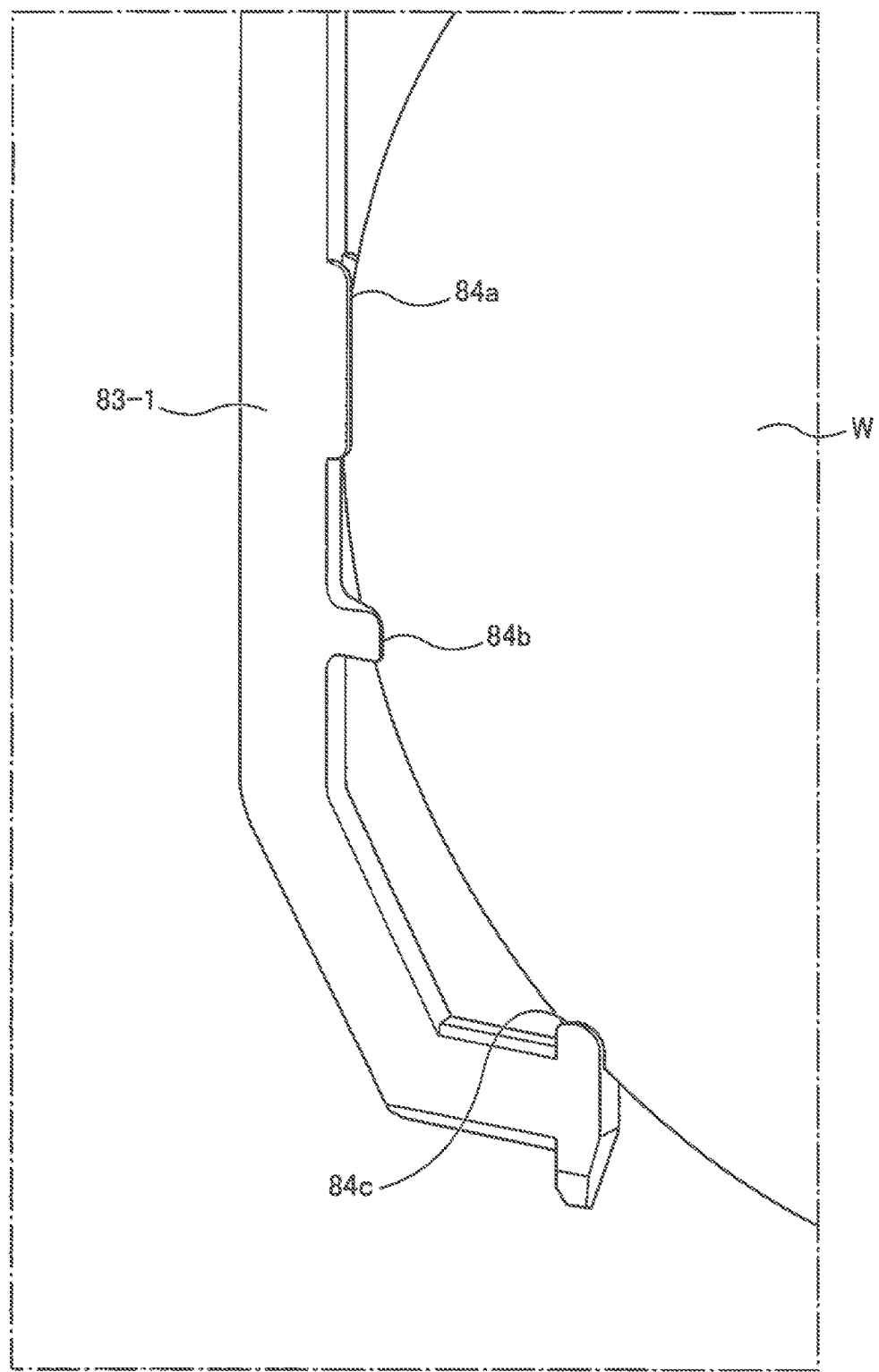
FIG. 4 is an enlarged perspective view of a holder section.

FIG. 4 is an enlarged perspective view of the holder portion 83-1 shown in FIG. 3. FIG. 4 shows a state in which the substrate holder 80 holds a substrate. The holder portion 83-1 has a plurality of slits 84a, 84b and 84c along a surface facing the holder portion 83-2, namely, the surface facing the space 84 shown in FIG. 3. Further, the holder portion 83-2 also has a plurality of slits similar to the slits in the holder portion 83-1 along a surface facing the holder portion 83-1, though not illustrated. An outer circumferential portion of a substrate N is fitted into the slits 84a, 84b and 84c of the holder portion 83-1 and the slits of the holder portion 83-2, and thereby the substrate N is held by the substrate holder 80. Thereby, the substrate N can be restrained from dropping from the substrate holder 80 when the substrate holder 80 is made horizontal.

<Fixing Unit>

Figure 5:
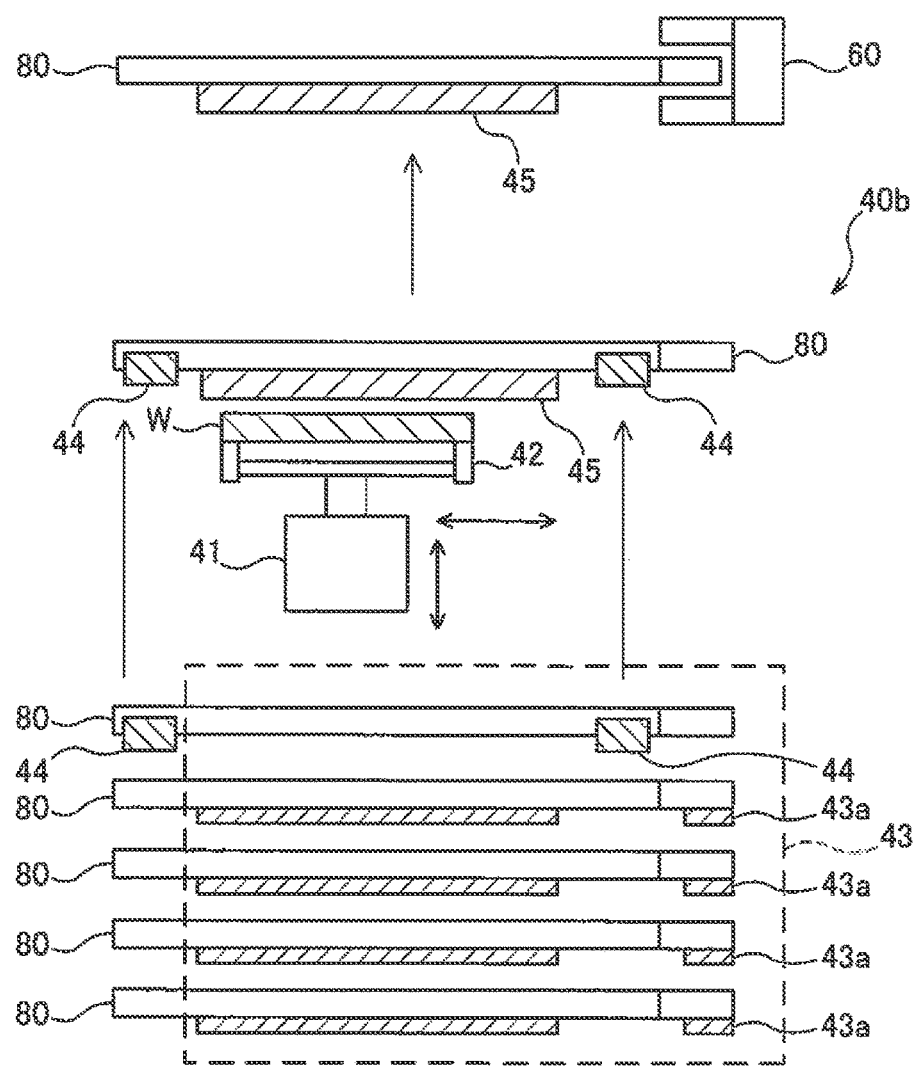
FIG. 5 is a schematic sectional side view of the fixing unit.

FIG. 5 is a schematic sectional side view of the fixing unit 40b shown in FIG. 2. Note that the fixing unit 40a also has a similar structure, and therefore, explanation will be omitted. The fixing unit 40b includes a holder stocker 43 capable of storing a plurality of substrate holders 80 that do not hold a substrate, a hand 42 for attaching and detaching the substrate N to and from the substrate holder 80, and a drive mechanism 41 for moving the hand 42 in the vertical direction and the horizontal direction.

The fixing unit 40b further includes movable holder receiving claws 44 for taking out the substrate holder 80 stored in the holder stocker 43 to move the substrate holder 80 to a predetermined position, and a movable holder support 45 for receiving the substrate holder 80 from the holder receiving claws 44 to move the substrate holder 80 further to another position.

The holder stocker 43 has a plurality of support shelves 43a formed in the horizontal direction therein. That is to say, slits are formed among the plurality of support shelves 43a. The substrate holder 80 which does not hold a substrate is inserted into the slit and is horizontally supported by the support shelf 43a.

The holder receiving claws 44 hold both outer sides of the holder portions 83-1 and 83-2 (see FIG. 3) of the substrate holder 80, for example, at four spots. The holder receiving claws 44 can perform an opening and closing operation between a state holding the holder portions 83-1 and 83-2 and a state releasing the holder portions 83-1 and 83-2. Further, the holder receiving claws 44 can move vertically between a position where the substrate holder 80 receives the substrate W from the hand 42, and the holder stocker 43.

The holder support 45 supports the substrate holder 80 from below and receives the substrate holder 80 from the holder receiving claws 44, in a position where the substrate holder 80 receives the substrate N from the hand 42. The holder support 45 lifts up the substrate holder 80, which is received from the holder receiving claws 44, to a position where a pair of holder clamps 60 of the substrate transfer device 50a or 50b grasps the substrate holder 80 (see FIG. 2).

When the substrate W is mounted on the substrate holder 80, the substrate holder 80 is first transferred to a position above the hand 42 from the holder stocker 43 by the holder receiving claws 44. The drive mechanism 41 raises the hand 42 which supports the substrate W from below and positions the substrate W in the space 84 (see FIG. 4) of the substrate holder 80. Subsequently, the drive mechanism 41 moves the hand 42 which supports the substrate W in the horizontal direction, and fits the substrate W into the slits 84a, 84b and 84c shown in FIG. 4. The substrate holder 80 on which the substrate W is mounted is transferred to the holder support 45 from the holder receiving claws 44, and is moved to a position to transfer the substrate holder 80 to the holder clamp 60 by the holder support 45. Thereafter, the substrate holder 80 is grasped by the holder clamp 60, and is transferred to a processing bath of a subsequent stage.

When the substrate W is detached from the substrate holder 80 after the substrate W is processed, the substrate holder 80 which is grasped by the holder clamp 60 is first transferred to the holder support 45. Thereafter, the holder support 45 lowers, and the substrate holder 80 is transferred to the holder receiving claws 44. In a position where the substrate holder 80 is transferred to the holder receiving claws 44, the substrate W is detached from the substrate holder 80 by the hand 42. The substrate holder 80 from which the substrate W is detached is returned to the holder stocker 43 by the holder receiving claws 44.

<Substrate Transfer Device>

Figure 6:
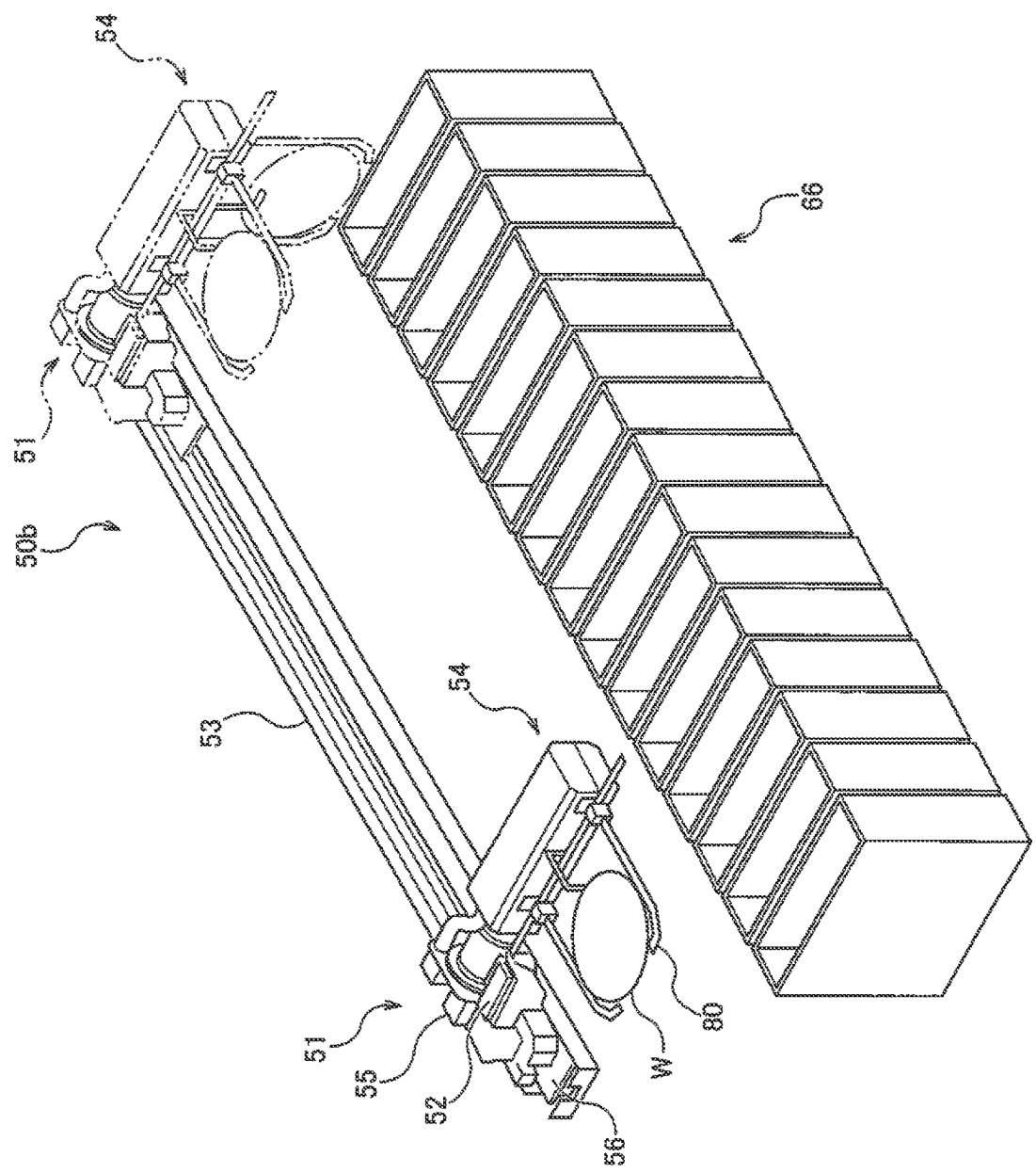
FIG. 6 is a perspective view of a substrate transfer device.
Figure 7:
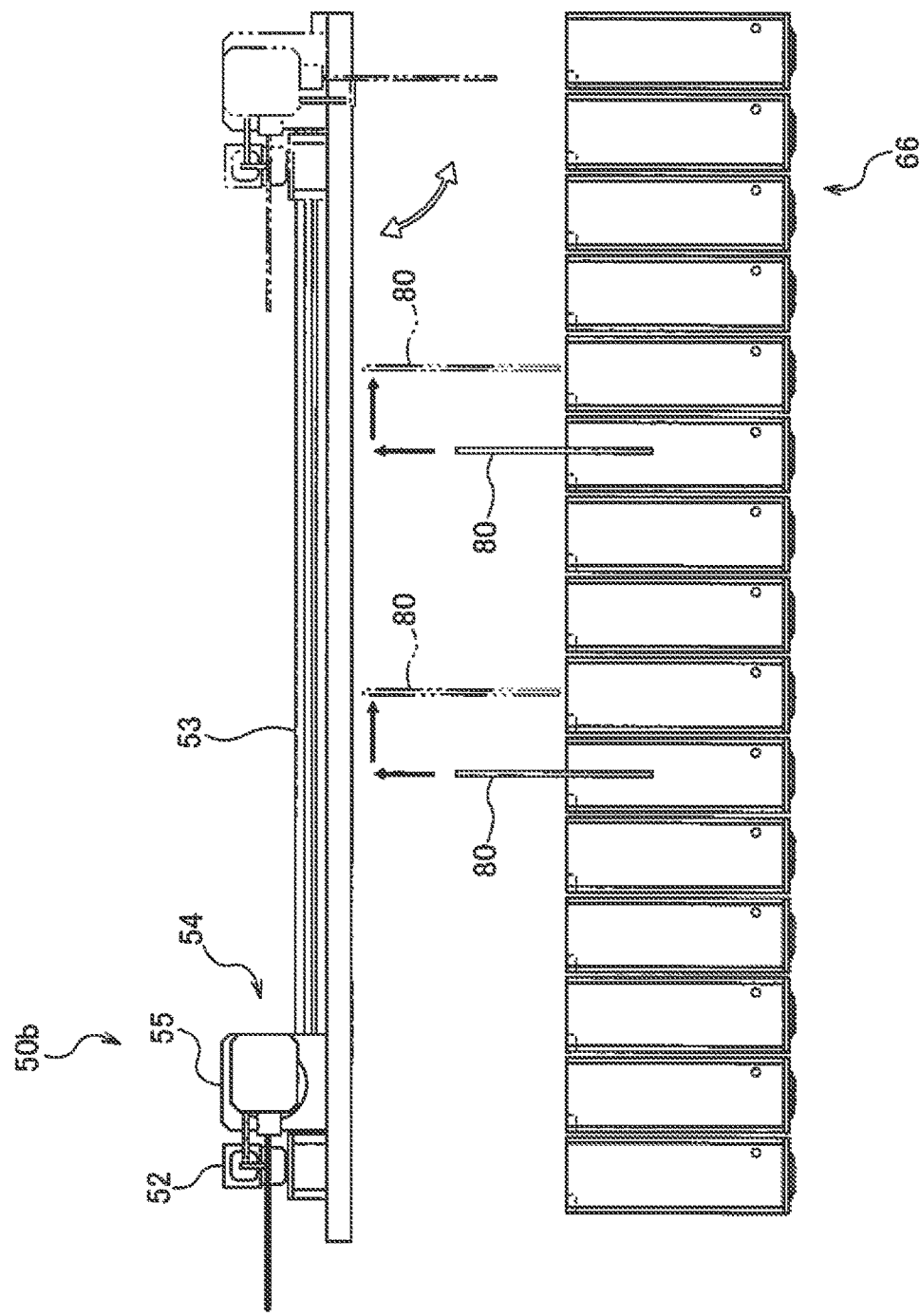
FIG. 7 is a side view of the substrate transfer device.
Figure 8:
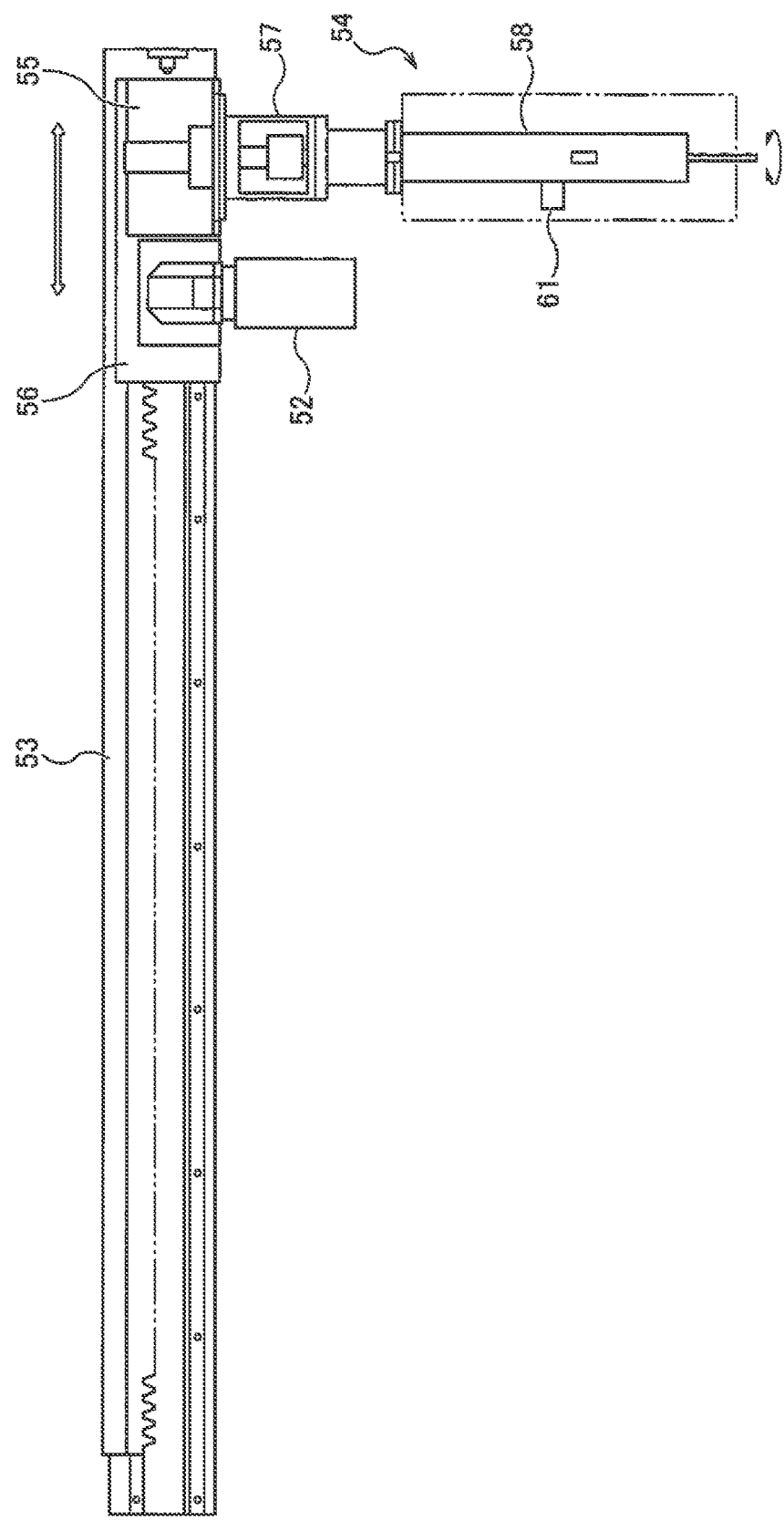
FIG. 8 is a top view of the substrate transfer device.
Figure 9:
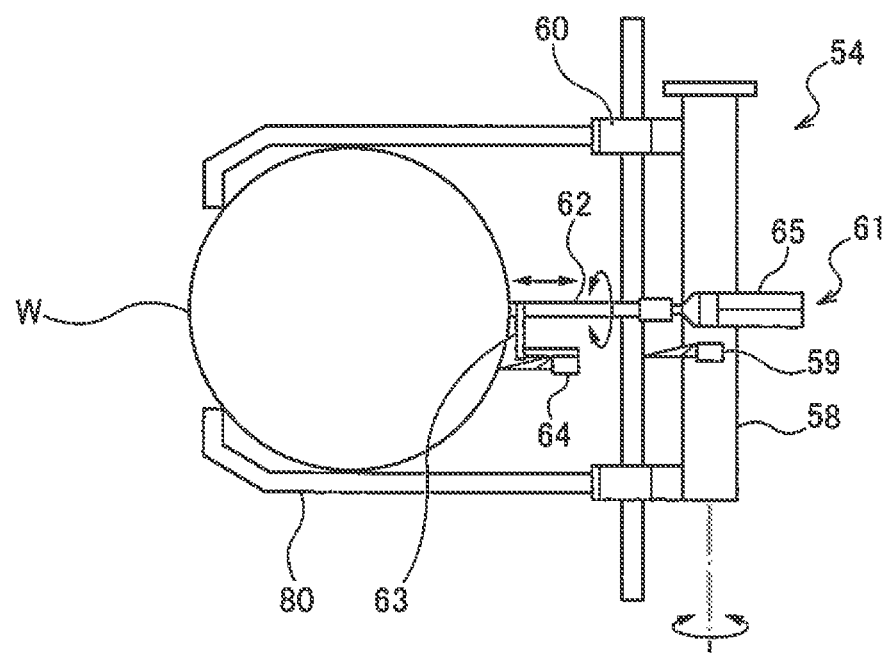
FIG. 9 is a partial enlarged view of a grasping mechanism.

Subsequently, the substrate transfer device 50b shown in FIG. 2 will be described. Note that the substrate transfer device 50a has a construction similar to that of the substrate transfer device 50b, and therefore, explanation will be omitted. FIG. 6 is a perspective view of the substrate transfer device 50b shown in FIG. 2. FIG. 7 is a side view of the substrate transfer device 50b. FIG. 8 is a top view of the substrate transfer device 50b. FIG. 9 is a partial enlarged view of a grasping mechanism. In FIGS. 6 and 7, a processing bath 66 is shown for convenience of explanation of the positional relation with the substrate transfer device 50b. The processing bath 66 shows the pre-wet bath 115, the etching module 120 and the like shown in FIG. 1 in an abbreviated manner, and the number of baths differs from what is shown in FIG. 1.

As shown in FIGS. 6 and 7, the substrate transfer device 50b has a grasping mechanism 54 (corresponding to one example of a grasping section) for grasping the substrate holder 80, and a transfer mechanism 51 (corresponding to one example of a transferring section) for transferring the substrate holder 80 which is grasped by the grasping mechanism 54. The transfer mechanism 51 has a travel base 56 to which the grasping mechanism 54 is attached, a guide rail 53 for guiding the travel base 56, and a travel motor 52 for causing the travel base 56 to travel on the guide rail 53. As shown by the broken lines in the drawings, the grasping mechanism 54 grasping the substrate holder 80 can travel along the guide rail 53 from one end to the other end of the guide rail 53 by the transfer mechanism 51. The grasping mechanism 54 grasps the substrate holder 80 with an in-plane direction of the substrate W being horizontally oriented. The travel motor 52 drives in this state, whereby the travel base 56 travels along the guide rail 53. Thereby, the transfer mechanism 51 transfers the substrate holder 80 so that the substrate holder 80 passes above the processing bath 66 with the in-plane direction of the substrate W being horizontally oriented. By the by, the term "in-plane direction of the substrate W" has same meaning as "the surface of the substrate W," which will be apparently understood from FIG. 7, etc, and the description below.

Further, the substrate transfer device 50b has a rotary motor 55 (corresponding to one example of a drive section) that rotates the grasping mechanism 54. The rotary motor 55 rotates the grasping mechanism 54 grasping the substrate holder 80 with the in-plane direction of the substrate N being horizontally oriented by approximately 90 degrees so that the in-plane direction of the substrate W is vertically oriented. The substrate holder 80 is transferred to the lifters 70 shown in FIG. 2 from the grasping mechanism 54 with the substrate holder 80 being vertically oriented, that is, with the in-plane direction of the substrate W held by the substrate holder 80 being vertically oriented. The substrate holder 80 which is transferred to the lifters 70 is stored into the processing bath 66 by the lifters 70.

Further, the rotary motor 55 can rotate the grasping mechanism 54 which grasps the substrate holder 80 with the in-plane direction of the substrate W being vertically oriented by approximately 90 degrees so that the in-plane direction of the substrate W is horizontally oriented. The substrate holder 80 is transferred to the grasping mechanism 54 from the lifters 70 shown in FIG. 2, with the substrate holder being vertically oriented. The substrate holder 80 which is transferred to the grasping mechanism 54 is rotated so that the substrate W is oriented in the horizontal direction by the rotary motor 55 rotating the grasping mechanism 54.

FIG. 7 shows a process in which the substrate holder 80 is taken out from the processing bath 66 and is stored into the adjacent processing bath 66, by the lifters 70 (not illustrated). The substrate transfer device 50b transfers the substrate holder 80 with the in-plane direction of the substrate W being horizontally oriented, and therefore, even when another substrate holder 80 is taken out from or stored into the processing bath 66, the substrate holder 80 can pass above the other substrate holder.

As shown in FIGS. 8 and 9, the grasping mechanism 54 has a rotary shaft 58 configured to be rotatable by the rotary motor 55, and a coupling 57 for coupling an output shaft not illustrated of the rotary motor 55 with the rotary shaft 58. The grasping mechanism 54 can change an orientation of the grasped substrate holder 80 between the vertical direction and the horizontal direction by the rotary shaft 58 being rotated in a circumferential direction thereof by the rotary motor 55.

Furthermore, as shown in FIG. 9, the grasping mechanism 54 has a pair of holder clamps 60 provided at the rotary shaft 58, a substrate presser 61 (corresponding to one example of a pressing member) that presses the substrate W to the substrate holder 80, and a holder detecting sensor 59 that detects presence or absence of the substrate holder 80. The holder clamps 60 grasp the grasped portions 85-1 and 85-2 (see FIG. 3) of the substrate holder 80. The holder detecting sensor 59 is, for example, an optical sensor or a magnetic sensor for detecting presence or absence of the substrate holder 80 when the holder clamps 60 grasp the substrate holder 80.

The substrate presser 61 has a shaft portion 62, an air cylinder 65 configured to slide the shaft portion 62 in an axial direction and rotates the shaft portion 62 in a circumferential direction, a pressing portion 63 that is in contact with the substrate W to press the substrate W to the substrate holder 80, and a substrate detecting sensor 64 that detects presence or absence of the substrate W. The shaft portion 62 has one end coupled to the air cylinder 65, and the other end coupled to the pressing portion 63. The pressing portion 63 is a rod-shaped member that has one end coupled to the other end of the shaft portion 62, and the other end extending in a substantially perpendicular direction to the axial direction of the shaft portion 62. The substrate detecting sensor 64 is, for example, an optical sensor or a magnetic sensor that is fixed to the other end of the pressing portion 63 via fixing means.

Figure 10:
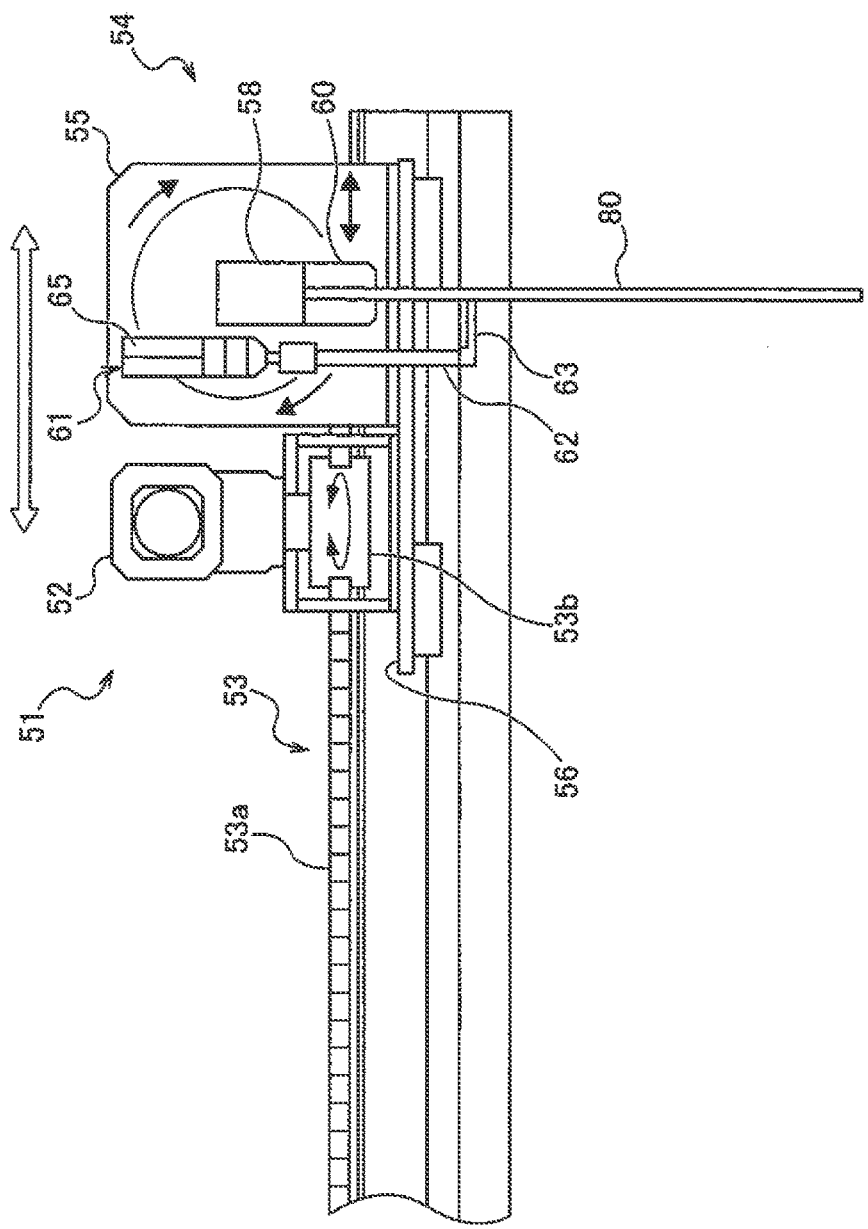
FIG. 10 is a side view showing a state in which the grasping mechanism grasps the substrate holder.
Figure 11:
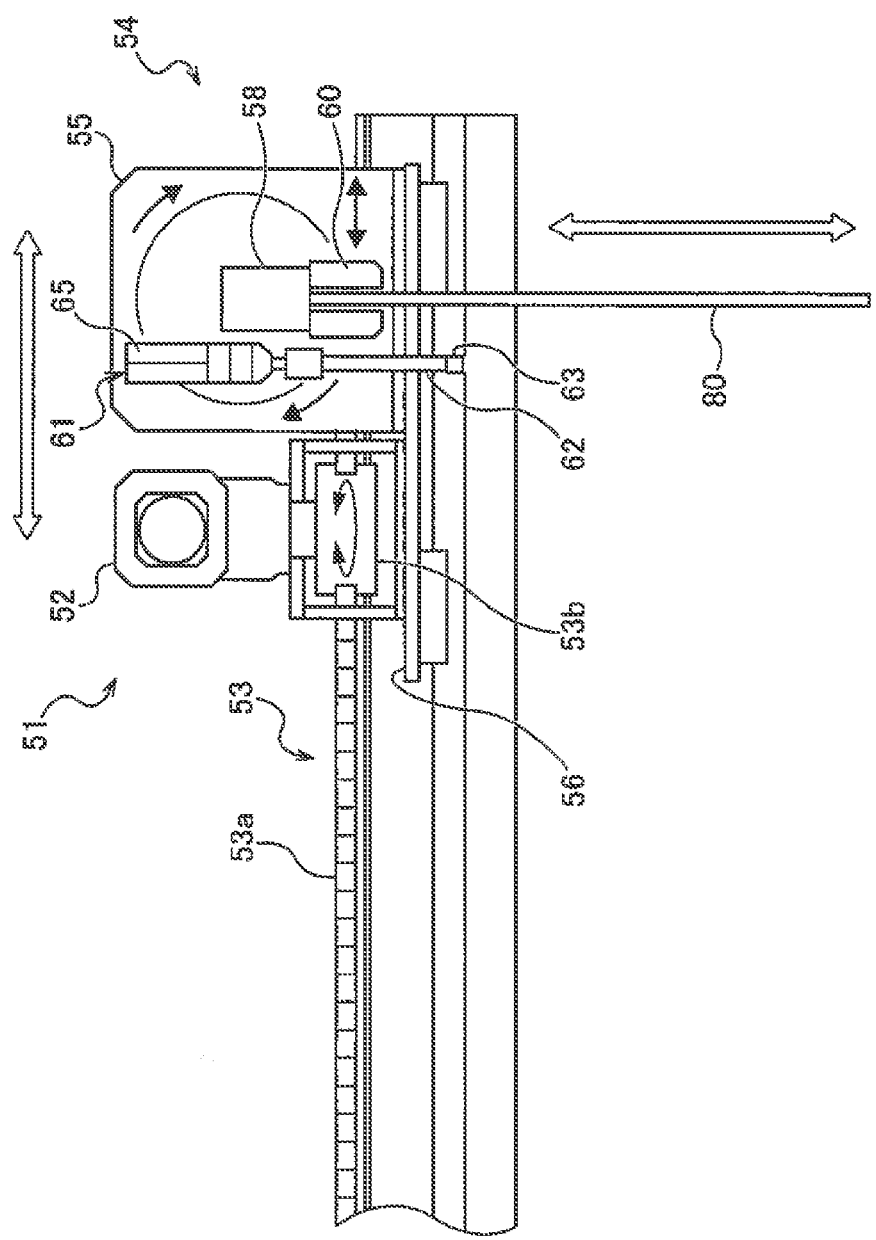
FIG. 11 is a side view showing a state in which the grasping mechanism releases the substrate holder.

FIG. 10 is a side view showing a state in which the grasping mechanism 54 grasps the substrate holder 80. FIG. 11 is a side view showing a state in which the grasping mechanism 54 releases the substrate holder 80. As shown an FIG. 10, when the holder clamps 60 of the grasping mechanism 54 grasp the substrate holder 80, the substrate presser 61 turns the pressing portion 63 by the air cylinder 65 so that the pressing portion 63 is positioned on an edge of the substrate W. Subsequently, the shaft portion 62 is slid in the axial direction by the air cylinder 65, the pressing portion 63 is in contact with the edge of the substrate W, and the substrate W is pressed to the substrate holder 80.

As shown in FIG. 11, when the holder clamps 60 release the substrate holder 80, the air cylinder 65 of the substrate presser 61 moves the shaft portion 62 upward, and turns the pressing portion 63 to release contact of the pressing portion 63 with the substrate W. Subsequently, when the grasping mechanism 54 transfers the substrate holder 80 to the lifters 70 not illustrated, the grasping mechanism 54 causes the holder claims 60 to release the substrate holder 80.

Note that as shown in FIGS. 10 and 11, the guide rail 53 of the transfer mechanism 51 includes a rack 53a along a rail direction thereof. Further, the transfer mechanism 51 has a pinion 53b configured to be rotatable by the travel motor 52. That is to say, the transfer mechanism 51 can cause the travel base 56 to travel along the guide rail 53 with a rack and pinion mechanism.

Next, a process of the substrate transfer device 50b transferring the substrate W will be described. The grasping mechanism 54 of the substrate transfer device 50b receives the substrate holder 80 holding the substrate N from the fixing unit 40b shown in FIG. 5 with the in-plane direction of the substrate N being horizontally oriented, that is, with the substrate holder 80 being in a horizontal state. The transfer mechanism 51 transfers the substrate holder 80 to pass the substrate holder 80 above the processing bath 66 with the in-plane direction of the substrate N being horizontally oriented. The transfer mechanism 51 stops the grasping mechanism 54 directly above the predetermined processing bath 66. The grasping mechanism 54 turns the substrate holder 80 so that the in-plane direction of the substrate W is vertically oriented. The lifters 70 shown in FIG. 2 receive the substrate holder 80 from the grasping mechanism 54 with the in-plane direction of the substrate N being vertically oriented. The lifters 70 store the received substrate holder 80 into the processing bath 66 with the in-plane direction of the substrate N being vertically oriented.

Subsequently, when the substrate holder 80 is transferred from the processing bath 66, the lifters 70 shown in FIG. 2 take out the substrate holder 80 from the processing bath 66. The grasping mechanism 54 of the substrate transfer device 50b receives the substrate holder 80 from the lifters 70 with the in-plane direction of the substrate W being vertically oriented. The grasping mechanism 54 turns the substrate holder 80 so that the in-plane direction of the substrate W is horizontally oriented. The transfer mechanism 51 causes the substrate holder 80 to pass above the processing bath 66, and transfers the substrate holder 80 to the processing bath 66 where a subsequent process is performed or the fixing unit 40b, with the in-plane direction of the substrate N being horizontally oriented.

As described above, in the substrate transfer devices 50a and 50b, the transfer mechanism 51 transfers the substrate holder 80 to pass the substrate holder 80 above the processing bath 66, with the in-plane direction of the substrate W being horizontally oriented, and therefore, a space in the vertical direction that is required for transfer of the substrate holder 80 can be made small. Therefore, even while another substrate holder 80 is stored into the processing bath 66, or another substrate holder 80 is taken out from the processing bath 66, the substrate holder 80 can be transferred to pass above the other substrate holder 80. Accordingly, even while the substrate holder 80 is put in or taken out from the processing bath 66, transfer of another substrate holder 80 does not have to be awaited, and therefore, the throughput of the substrate processing apparatus 250 can be improved. Further, since the substrate holder 80 is transferred in the horizontal direction with the in-plane direction of the substrate W being horizontally oriented, air resistance to the substrate W generated by transfer can be reduced, and the substrate holder 80 can be transferred at a relatively high speed. Note that "the in-plane direction of the substrate W is horizontally oriented" is not limited to the case where the in-plane direction of the substrate W is oriented completely in the horizontal direction, but also includes a case where the in-plane direction of the substrate W has a slight angle to the horizontal direction.

In particular, even when the lifters 70 which move the substrate holder 80 vertically with respect to the processing bath 66, and put and take out the substrate holder 80 in and from the processing bath 66 are provided in the substrate processing apparatus 250 as the present embodiment, processing of putting in and taking out of the substrate holder 80 by the lifters 70, and transfer of other substrate holders 80 by the substrate transfer devices 50a and 50b can be performed at independent timings respectively without interfering with one another. Accordingly, even while the lifters 70 put and take out the substrate holder 80 in and from the processing bath 66, transfer of other substrate holders 80 by the substrate transfer devices 50a and 50b does not have to be awaited, and therefore, the throughput of the substrate processing apparatus 250 can be improved. That is to say, an operation of the lifters 70 putting and taking out the substrate holder 80 in and from the processing bath 66 in one of the etching modules 120, for example, and an operation of the substrate transfer devices 50a and 50b transferring other substrate holders 80 to other etching modules 120 above the one etching module 120, or collecting other substrate holders 80 from the other etching modules 120 can be independently performed without waiting for mutual operations.

Further, the substrate transfer devices 50a and 50b have the rotary motors 55 which rotationally drive the grasping mechanisms 54 grasping the substrate holders 80 so that the in-plane directions of the substrates W are vertically oriented. Accordingly, even when the processing bath 66 stores the substrate holder 80 in the vertical direction, the substrate transfer devices 50a and 50b can transfer the substrate holders 80 to the lifters 70 with the in-plane directions of the substrates W being vertically oriented, and the substrate holders 80 can be easily stored into the processing baths 66. Note that "the in-plane direction of the substrate W is vertically oriented" in this case is not limited to the case where the in-plane direction of the substrate W is oriented completely in the vertical direction, but also includes a case where the in-plane direction of the substrate W has a slight angle to the vertical direction.

Further, the grasping mechanism 54 has the substrate presser 61 which presses the substrate N to the substrate holder 80. Therefore, even when the substrate holder 80 is transferred so that the in-plane direction of the substrate W is horizontally oriented, the substrate W can be restrained from dropping from the substrate holder 80.

Figure 12:
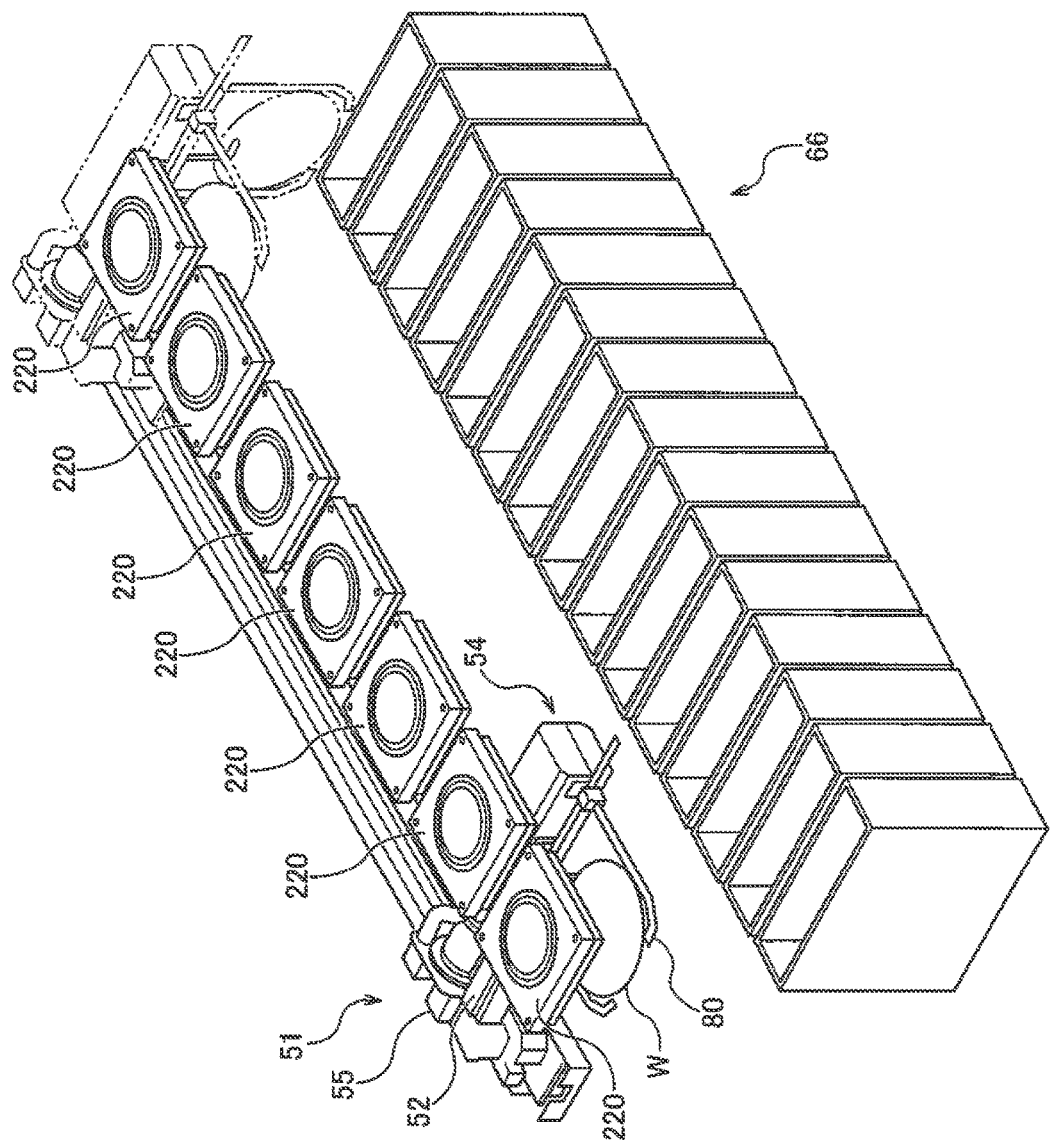
FIG. 12 is a perspective view showing the substrate transfer device including FFUs.
Figure 13:
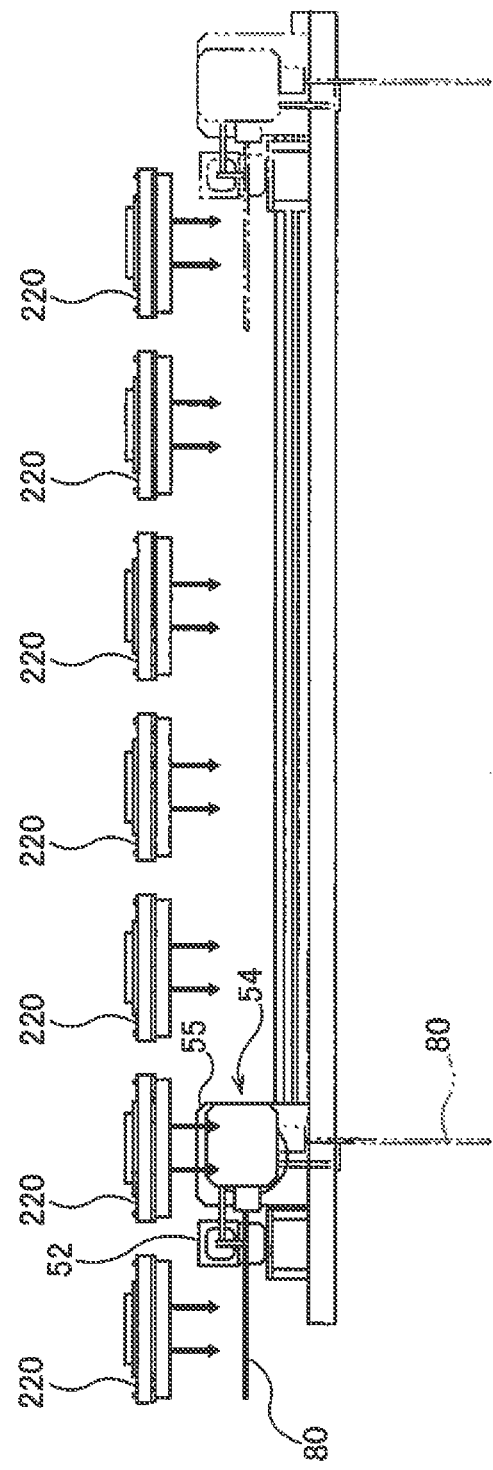
FIG. 13 is a side view showing the substrate transfer device including the FFUs.

FIG. 12 is a perspective view showing the substrate transfer device 50b including FFUs (fan filter units), and FIG. 13 is a side view showing the substrate transfer device 50b including the FFUs. The substrate transfer devices 50a and 50b according to the present embodiment can additionally include FFUs 220 shown in FIGS. 12 and 13. The FFU 220 (corresponding to one example of a blowing mechanism) is a fan in which a filter is incorporated, and as shown in FIG. 12, a plurality of FFUs 220 are disposed along above a path on which the substrate holder 80 is transferred. The FFU 220 is connected to a duct or the like not illustrated, for example, and is configured to blow gas such as air from the duct or the like downward through a filter.

As shown in FIG. 13, the FFU 220 is provided at a position higher than the substrate holder 80 which is transferred. The FFU 220 blows out the gas through the filter downward, whereby particles and the like in an atmosphere can be prevented from rising to an upper space of the substrate processing apparatus 250. Accordingly, particles are restrained from attaching to the substrate W held by the substrate holder 80 which is transferred. Further, the grasping mechanism 54 is configured to grasp the substrate holder 80 in such a manner that a processed surface of the substrate W faces upward. Thereby, the particles which are pushed to a bottom portion of the substrate processing apparatus 250 can be more restrained from attaching to the processed surface of the substrate W.

<Lifter>

Figure 14:
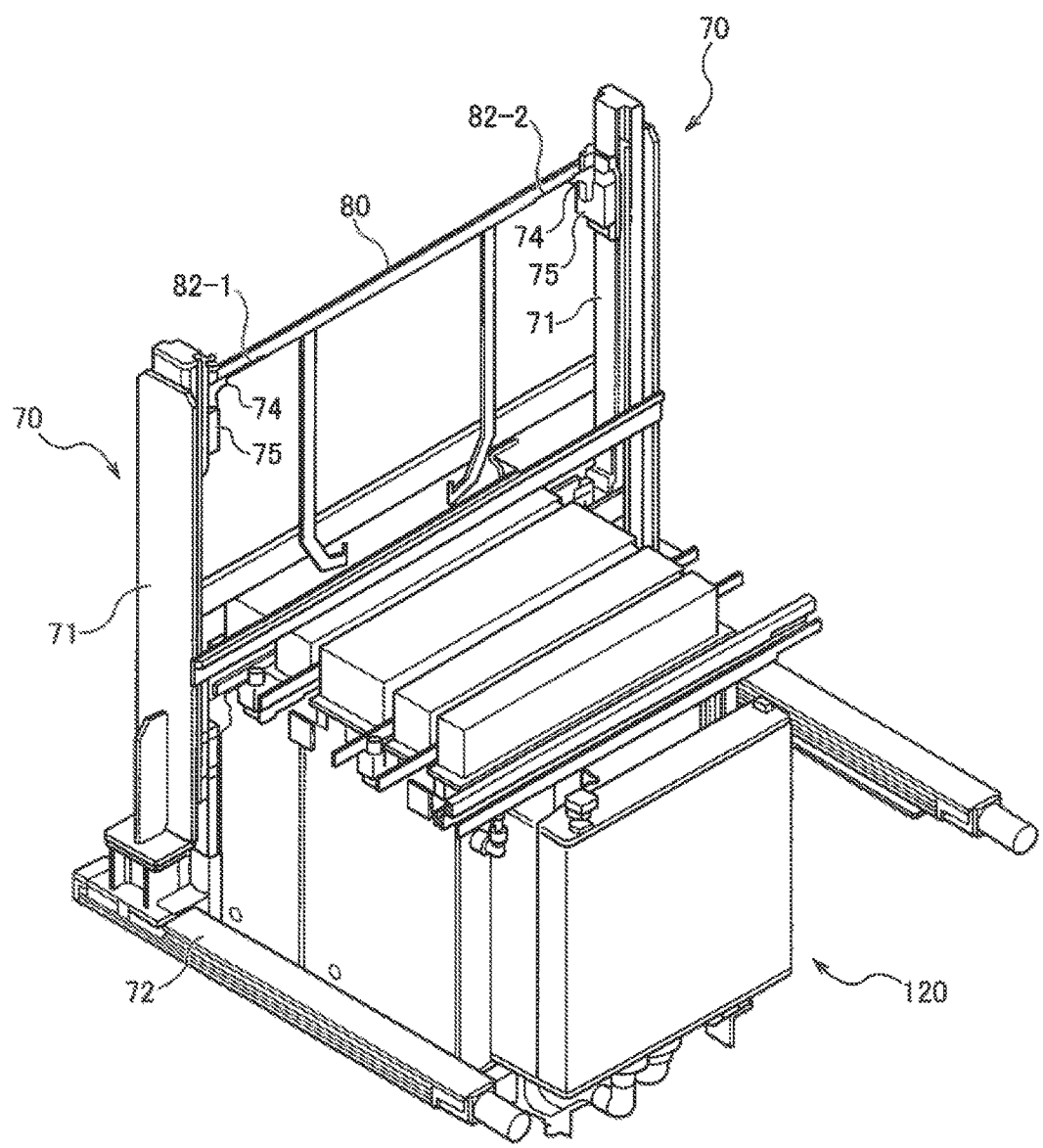
FIG. 14 is a perspective view showing a lifter.

Next, details of the lifters 70 which are respectively provided at the pre-wet baths 115a and 115b, the pre-wet baths 145a and 145b, the etching module 120 and the resist removing module 150 which are shown in FIG. 1 will be described. FIG. 14 is a perspective view showing the lifters 70. In order to describe a positional relation between the lifters 70 and the processing bath, FIG. 14 also shows the etching module 120.

As shown in FIG. 14, the lifters 70 include a pair of rail portions 71 that are disposed at both sides of the etching module 120, slide portions 75 that are slidably provided at the rail portions 71, support portions 74 that are provided at the slide portions 75, and horizontal moving mechanisms 72 that can move the rail portions 71 in the horizontal direction.

The horizontal moving mechanisms 72 are provided along the horizontal direction at both the sides of the etching module 120. The pair of rail portions 71 extends in the vertical direction from the horizontal moving mechanisms 72, and includes rails for the slide portions 75 to slide, at opposing sides of the pair of rail portions 71. The slide portions 75 are configured to be slidable on the rail portions 71 in the vertical direction along the rails of the rail portions 71. Note that the slide portions 75 are slid in the vertical direction by a drive device not illustrated.

The support portions 74 are members formed to protrude toward the opposing sides of the pair of the rail portions 71, and support the arm portions 82-1 and 82-2 of the substrate holder 80 from below as illustrated. That is to say, the substrate holder 80 is supported by the support portions 74 to be positioned between the pair of the rail portions 71.

When the lifters 70 receive the substrate holder 80 from the substrate transfer devices 50a or 50b shown in FIG. 1, the grasping mechanism 54 (refer to FIGS. 6 to 11) of the substrate transfer device 50a or 50b first moves above the lifters 70 while the grasping mechanism 54 grasps the substrate holder 80 horizontally. Subsequently, the grasping mechanism 54 turns, whereby the substrate holder 80 is turned so that the in-plane direction of the substrate W is perpendicularly oriented. The support portions 74 of the lifters 70 slide in the upward direction with the rail portions 71, and support the substrate holder 80 from below. The grasping mechanism 54 releases the substrate holder 80 in the state in which the support portions 74 support the substrate holder 80, whereby the substrate holder 80 is passed to the support portions 74. If necessary, the lifters 70 move the rail portions 71 in the horizontal direction by the horizontal moving mechanisms 72, and position the rail portions 71 at lateral sides of a predetermined processing bath of the etching module 120. Thereby, the substrate holder 80 is disposed directly above the predetermined processing bath. In this state, the support portions 74 slide downward along the rail portions 71, whereby the substrate holder 80 can be stored into the processing bath.

When the lifters 70 transfer the substrate holder 80 to the substrate transfer devices 50a and 50b shown in FIG. 1, the support portions 74 first support the arm portions 82-1 and 82-2 of the substrate holder 80 from below, which is stored in the processing bath of the etching module 120. Subsequently, the support portions 74 rise along the rail portions 71, whereby the substrate holder 80 is taken out from the processing bath. In the state in which the support portions 74 support the substrate holder 80, the lifters 70 move the rail portions 71 horizontally to the predetermined transfer position of the substrate transfer device 50a or 50b by the horizontal moving mechanisms 72, if necessary. The grasping mechanism 54 of the substrate transfer device 50a or 50b grasps the substrate holder 80, and thereafter the support portions 74 of the lifter 70 lower along the rail portions 71, whereby the substrate holder 80 is passed to the substrate transfer device 50a or 50b.

Even when the lifters 70 which move the substrate holder 80 vertically to the processing bath of the etching module 120, and put and take out the substrate holder 80 in and from the processing bath are provided in the substrate processing apparatus 250 as the present embodiment, the processing of putting in and taking out the substrate holder 80 by the lifters 70, and transfer of other substrate holders 80 by the substrate transfer devices 50a and 50b shown in FIGS. 6 to 13 can be performed at independent timings respectively. Accordingly, even while the substrate holder 80 is put in or taken out from the processing bath, transfer of other substrate holders 80 does not need to be awaited, and therefore the throughput of the substrate processing apparatus 250 can be improved.

The embodiment of the present invention is described above, but the aforementioned embodiment of the present invention is for facilitating understanding of the present invention, and does not restrict the present invention. The present invention can be modified and improved without departing from the scope of the invention, and the present invention includes equivalents of the present invention as a matter of course. Further, the respective components described in the claims and the description can be optionally combined or omitted within the range where at least part of the aforementioned problem can be solved, or in the range where at least part of the effect is provided.

REFERENCE SIGNS LIST

50a Substrate transfer device
50b Substrate transfer device
51 Transfer mechanism
54 Grasping mechanism
55 Rotary motor
60 Holder clamp
66 Processing bath
70 Lifter

What is claimed is:

1. A substrate processing apparatus, comprising:
a substrate holder configured to hold a substrate;
a fixing unit configured to mount and remove the substrate on and from the substrate holder,
a substrate dryer configured to dry the substrate;
a robot configured to transfer the substrate at least between the fixing unit and the substrate dryer;
a processing bath configured to process the substrate while the substrate holder is holding the substrate such that the substrate is in a vertical orientation; and
a substrate transfer device including a grasping section configured to grasp the substrate holder, and a transferring section configured to transfer the substrate holder grasped by the grasping section,
wherein the substrate transfer device is configured to transfer the substrate holder at least between the fixing unit and the processing bath,
the grasping section is configured to rotate the substrate holder between the vertical orientation and a horizontal orientation, which is angularly offset from the vertical orientation while the substrate holder is holding the substrate, and
the transferring section is configured to transfer the substrate holder and the substrate while the substrate holder is holding the substrate from the processing bath to the fixing unit, with the substrate in the horizontal orientation, along a path that is above the processing bath.

2. The substrate processing apparatus according to claim 1,
wherein the processing bath includes a pre-wet bath configured to enhance hydrophilicity of a surface of the substrate.

3. The substrate processing apparatus according to claim 1, further comprising a plurality of substrate holders, which includes the substrate holder, wherein the fixing unit comprises a stocker configured to store at least a portion of the plurality of substrate holders that are not holding a substrate.

4. The substrate processing apparatus according to claim 1, wherein the vertical orientation is angularly offset from the horizontal orientation by 90 degrees.

5. The substrate processing apparatus according to claim 1, further comprising:
   a fan filter unit positioned above the path.

6. The substrate processing apparatus according to claim 1,
   wherein the substrate transfer device is configured to grasp the substrate holder in such a manner that a processed surface of the substrate faces upward while transferring the substrate holder along the path.

7. A plating apparatus, comprising:
   a substrate holder configured to hold a substrate;
   a fixing unit configured to mount and remove the substrate on and from the substrate holder,
   a substrate dryer configured to dry the substrate;
   a robot configured to transfer the substrate at least between the fixing unit and the substrate dryer;
   a plating bath configured to process the substrate while the substrate holder is holding the substrate such that the substrate is in a vertical orientation; and
   a substrate transfer device including a grasping section configured to grasp the substrate holder, and a transferring section configured to transfer the substrate holder grasped by the grasping section,
   wherein the substrate transfer device is configured to transfer the substrate holder at least between the fixing unit and the plating bath,
   the grasping section is configured to rotate the substrate holder and the substrate while the substrate holder is holding the substrate between the vertical orientation and a horizontal orientation which is angularly offset from the vertical orientation, and
   the transferring section is configured to transfer the substrate holder and the substrate while the substrate holder is holding the substrate from the plating bath to the fixing unit, with the substrate in the horizontal orientation, along a path that is above the plating bath.

8. The plating apparatus according to claim 7, further comprising:
   a pre-wet bath configured to enhance hydrophilicity of a surface of the substrate.

9. The plating apparatus according to claim 7,
   further comprising a plurality of substrate holders, which includes the substrate holder, wherein the fixing unit comprises a stocker configured to store at least a portion of the plurality of substrate holders that are not holding a substrate, further comprising a plurality of substrate holders, which includes the substrate holder, wherein the fixing unit comprises a stocker configured to store at least a portion of the plurality of substrate holders that are not holding a substrate.

10. The plating apparatus according to claim 7, further comprising:
    a fan filter unit positioned above the path.

11. The plating apparatus according to claim 7,
    wherein the substrate transfer device is configured to grasp the substrate holder in such a manner that a processed surface of the substrate faces upward while transferring the substrate holder along the path.

* * * * *